(12) United States Patent
Chiu

(10) Patent No.: US 7,025,129 B2
(45) Date of Patent: *Apr. 11, 2006

(54) ADHESIVE TO ATTACH A COOLING DEVICE TO A THERMAL INTERFACE

(75) Inventor: Chia-Pin Chiu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 602 days.

This patent is subject to a terminal disclaimer.

(21) Appl. No.: 10/007,532

(22) Filed: Oct. 26, 2001

(65) Prior Publication Data

US 2003/0205368 A1    Nov. 6, 2003

Related U.S. Application Data

(63) Continuation of application No. 09/158,227, filed on Sep. 22, 1998, now Pat. No. 6,315,038.

(51) Int. Cl.
    *H05K 7/20*    (2006.01)
(52) U.S. Cl. ...................................... 165/185; 361/705
(58) Field of Classification Search ................ 165/185, 165/80.3, 905; 361/705
    See application file for complete search history.

(56) References Cited

U.S. PATENT DOCUMENTS

| | | | |
|---|---|---|---|
| 4,915,167 A | | 4/1990 | Altoz |
| 5,216,283 A | | 6/1993 | Lin |
| 5,552,637 A | * | 9/1996 | Yamagata ................... 257/717 |
| 5,635,917 A | * | 6/1997 | Todman ................. 340/825.37 |
| 5,679,457 A | | 10/1997 | Bergerson |
| 5,745,344 A | | 4/1998 | Baska et al. |
| 6,261,404 B1 | * | 7/2001 | Baska et al. ................ 156/310 |
| 6,315,038 B1 | * | 11/2001 | Chiu .......................... 165/185 |

OTHER PUBLICATIONS

Heat Transfer Fundamentals. Whitepaper [online] [Retrieved on Jun. 27, 2000] Retrieved from the Internet: <URL:http://www.chomerics.com/heattransferfund.html. pp. 1-7.
Kent Young, Thermal Gap Fillers: New Material Overcomes Performance Trade-Offs. Chomerics, Marlow, Buckinghamshire, UK. pp. 1-2.
THERMFLOW™ Low Thermal Resistance Phase-Change Interface Pads. [online] Product Data Sheet. [Retrieved on Oct. 25, 2001] Retrieved from the Internet: <URL:http://www.chomerics.com/products/documents/TB77page.pdf. pp. 1-2.

* cited by examiner

*Primary Examiner*—Allen J. Flanigan
(74) *Attorney, Agent, or Firm*—Blakely, Sokoloff, Taylor & Zafman LLP

(57) ABSTRACT

A method of providing thermal connection between a thermal cooling device and an integrated circuit package is provided. An adhesive is applied to a thermal interface outside a heat transfer area thereof. The thermal interface is attached to the cooling device. The device to be cooled is attached to the thermal interface.

19 Claims, 4 Drawing Sheets ated to the present invention avoids utilizing PSA on the entire thermal interface surface. Using PSA on the entire thermal interface surface would be equivalent to adding in an insulating layer. This would significantly increase the overall thermal resistance between the device to be cooled such as an integrated circuit package and a cooling device such as a heat sink or thermal plate. By applying an adhesive outside the heat transfer area of the thermal interface, the embodiment of the method of the present invention contributes to providing thermal connection between the cooling device and the device to be cooled without obstructing a heat transfer area of the thermal interface.

ADHESIVE TO ATTACH A COOLING DEVICE TO A THERMAL INTERFACE

This application is a continuation patent application of application Ser. No. 09/158,227, entitled Application of Pressure Sensitive Adhesive (PSA) to Pre-attach Thermal Interface Film/Tape to Cooling Device, and filed on Sep. 22, 1998 now U.S. Pat. No. 6,315,038.

BACKGROUND OF THE INVENTION (1) Field of the Invention

The present invention relates to the field of cooling electronic components and circuits. More specifically, the present invention relates to attaching electronic components to cooling devices.

(2) Description of the Related Art

Cooling devices such as heat sinks or thermal plates are used in conjunction with electronic and microelectronic circuits/components for cooling these circuits/components. Generally, integrated circuit packages may be cooled by attaching these packages to heat sinks, thermal plates, or other such cooling devices. Heat sinks or thermal plates dissipate the heat generated by the attached integrated circuit packages during the operation of these circuits. To provide optimal heat transfer, heat sinks or thermal plates are designed to have, generally, a large surface area. A surface area, herein refers to any area of the heat sink or thermal plate in contact with a cooling fluid such as air. The size of the surface area may generally determine the heat dissipating capacity of a heat sink or thermal plate.

Typically, heat sinks have a plurality of fins upwardly extending from the base plate. The fins conduct heat from the base plate. Heat is dissipated by a cooling fluid, such as air, flowing through spaces located between the fins. Typically, a cooling space defined by the fins is defined by the base plate and the vertical surfaces of two adjacent fins. The cooling fluid flows through the cooling spaces, thereby making contact with the fins, removing the heat by thermal dissipation (convection) from the fins, and further driving the dissipated heat outside the heat sink. Most heat sinks or thermal plates, are attached to the device to be cooled by way of a base plate. The larger the base plate the more efficient is the heat transfer between the device to be cooled (integrated circuit package) and the cooling device (heat sink or thermal plate).

Generally, a thermal interface such as a film/tape attached between the integrated circuit package and a base plate may be used to reduce the thermal resistance between the integrated circuit package and the heat sink or thermal plate. A thin layer of pressure sensitive adhesive (PSA) may be applied to the entire thermal interface surface to attach the thermal interface to the heat sink. However, the PSA is not a good thermal conductor.

It is desirable to provide a way of attaching a thermal interface to a cooling device without adding substantial thermal resistance between a device to be cooled such as an integrated circuit package and a cooling device such as a heat sink or a thermal place.

SUMMARY OF THE INVENTION

The present invention provides a method of providing thermal connection between a cooling device and a device to be cooled. An adhesive is applied to a thermal interface outside a heat transfer area of the thermal interface. The thermal interface is attached to the cooling device. The device to be cooled is attached to the thermal interface.

BRIEF DESCRIPTION OF THE DRAWINGS

The features, aspects and advantages of the present invention will become more fully apparent from the following Detailed Description, appended claims and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known elements, structures, and techniques have not been shown in detail to avoid obscuring the present invention.

The present invention provides a method of providing thermal connection between a cooling device and a device to be cooled. An adhesive is applied to a thermal interface outside a heat transfer area of the thermal interface. The thermal interface is attached to the cooling device. The device to be cooled is attached to the thermal interface. The embodiment of the present invention avoids utilizing PSA on the entire thermal interface surface. Using PSA on the entire thermal interface surface would be equivalent to adding in an insulating layer. This would significantly increase the overall thermal resistance between the device to be cooled such as an integrated circuit package and a cooling device such as a heat sink or thermal plate. By applying an adhesive outside the heat transfer area of the thermal interface, the embodiment of the method of the present invention contributes to providing thermal connection between the cooling device and the device to be cooled without obstructing a heat transfer area of the thermal interface.

Figure 1:
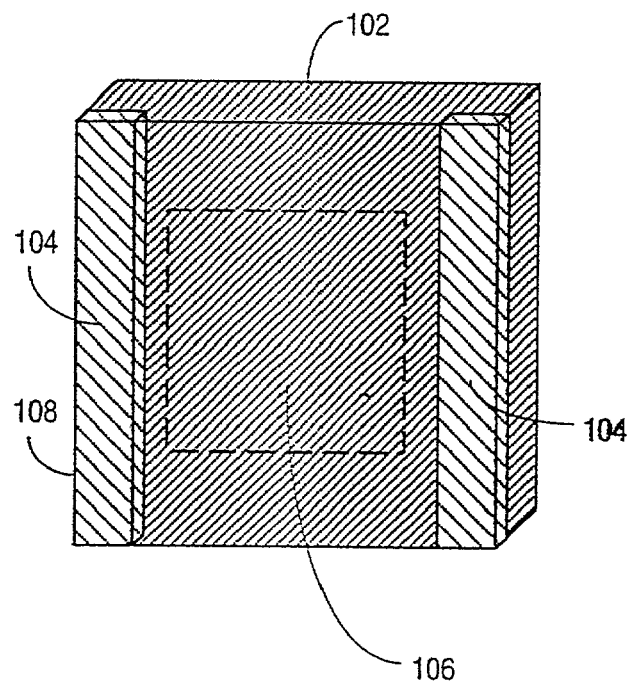
FIG. 1 illustrates a top view of a thermal interface to which an adhesive is applied according to one embodiment of the present invention.

FIG. 1 illustrates a thermal interface 102 to which an adhesive pattern (hereinafter referred to as "adhesive") 104 is applied. In one embodiment according to the present invention, adhesive 104 is a pressure sensitive adhesive (PSA) but the present invention is not limited in scope to a pressure sensitive adhesive implementation of adhesive 104. Also in one embodiment of the present invention described herein the PSA 104 is applied alongside two edges 108 of thermal interface 102. The two strips of PSA 104 have a thickness in a range of approximately 0.0125 to 0.025 mm. Thermal interface 102 may be made of materials including silicone, elastomeric materials, or phase-change materials. One example of a thermal interface material is Chomerics T443 film manufactured by Parker Hannifin Corp., Chomerics Division, located at 77 Dragon Court, Woburn, Mass. 01888.

The PSA is applied to the periphery of the thermal interface 102 so that a heat transfer area or contact area 106 (shown in dotted lines) remains exposed. Proper transfer of heat is thus allowed through the thermal interface between a device to be cooled such as an integrated circuit package, for example, and a cooling device, such as a heat sink or a thermal plate, for example. The integrated circuit package and the thermal plate are later attached to thermal interface 102. Heat transfer area 106 is equal to or larger than a contact area of the integrated circuit package that is later attached to the thermal interface.

Figure 2:
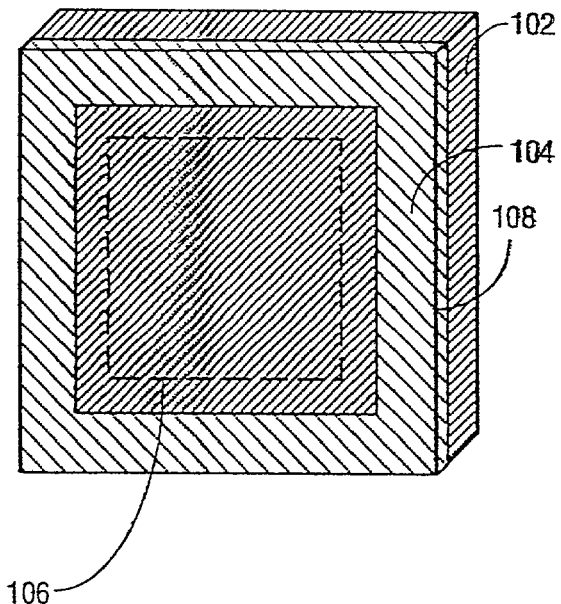
FIG. 2 illustrates a top view of an alternative embodiment of the thermal interface with an adhesive applied along the entire periphery of the thermal interface.

FIG. 2 shows an alternative embodiment of thermal interface 102 of the present invention. PSA pattern 104 is applied along the entire periphery (4 edges 108) of thermal interface 102.

Figure 3:
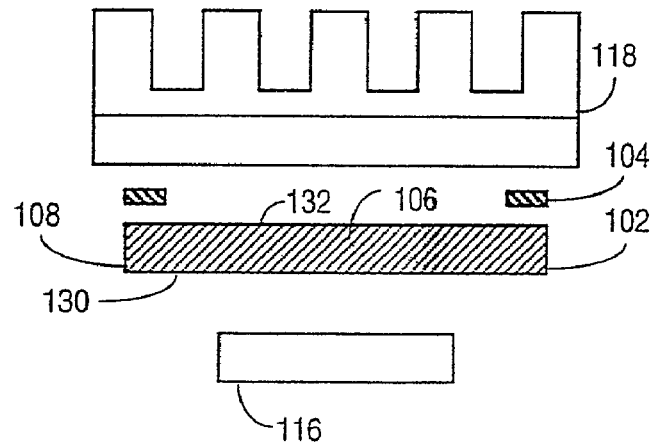
FIG. 3 illustrates an exploded cross-sectional view through a number of devices to be assembled together according to one embodiment of the present invention.

FIG. 3 illustrates an exploded cross-sectional view of an assembly including an integrated circuit package 116, thermal interface 102, PSA 104 and a heat sink 118. Thermal interface 102 has a first surface 130 to which the integrated circuit package 116 is later attached and a second surface 132 to which PSA 104 is later attached.

Figure 4:
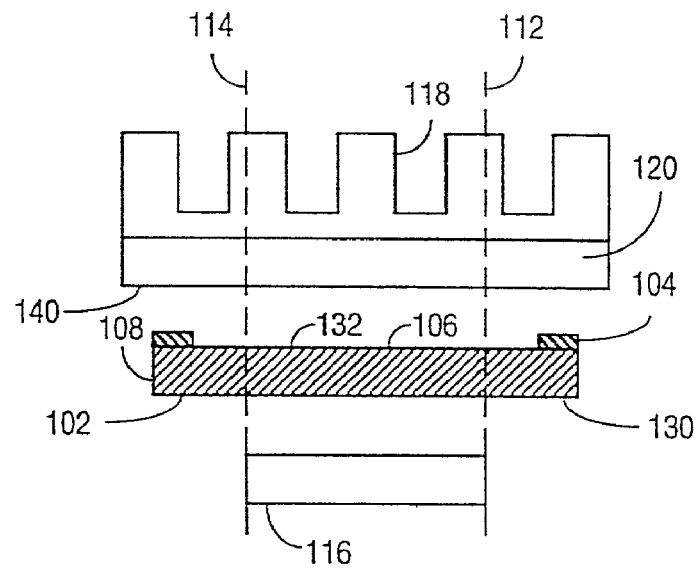
FIG. 4 illustrates a cross-sectional view through a thermal interface with a pressure sensitive adhesive (PSA) pattern attached to the thermal interface near the edges of the thermal interface.

FIG. 4 illustrates an adhesive, such as PSA 104, applied to surface 132 of thermal interface 102 which is interfacing between integrated circuit package 116 and a cooling device. The cooling device may be a heat sink (as illustrated in the figure), or any other cooling devices such as thermal plates, heat pipes, thermoelectric coolers, water-cooled metal plates, etc.

Two strips of PSA 104 are applied to the thermal interface 102 near edges 108 of thermal interface 102. The strips of PSA 104 are attached outside heat transfer area 106 defined by vertical dotted lines 114 and 112, so that the heat emanated from integrated circuit package 116 is efficiently transferred by thermal interface 102 to base plate 120 of heat sink 118.

Figure 5:
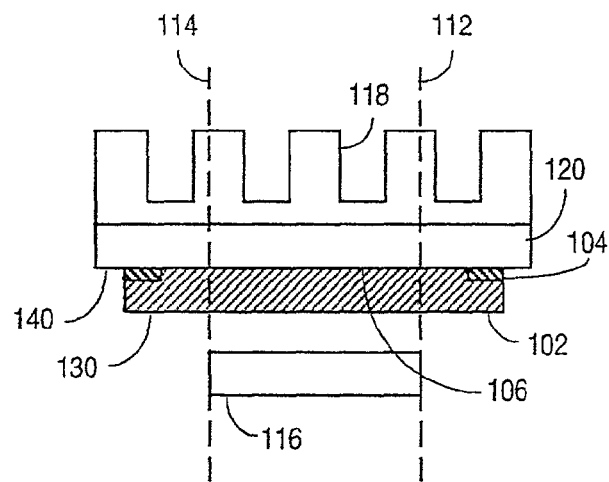
FIG. 5 illustrates a cross-sectional view through a heat sink to which the thermal interface, with the PSA pattern applied near the edges of the thermal interface, is attached.

Next, thermal interface 102, with PSA strips 104 applied near edges thereof, is attached to a surface 104 of base plate 120 as illustrated in FIG. 5. The attachment is mainly due to an adhesive surface of PSA 104 that makes contact with surface 140 of base plate 120. Note thet PSA 104 is is compliable, becoming very thin when thermal interface 102 is pressed and attached to base plate 120 of heat sink 118. Heat may be transfered from the integrated circuit package 116 to the heat sink 118 mainly via heat transfer are 106, demarcated by dotted lines 112 and 114. Heat transfer area 106 is not covered by PSA 104. The vendor of the heat sink may then ship the assembly, including the heat sink 118 with the thermal interface 102 attached thereto, to the manufacturer of the integrated circuit package, for further assembling the integrated circuit package 116 to the assembly.

Figure 6:
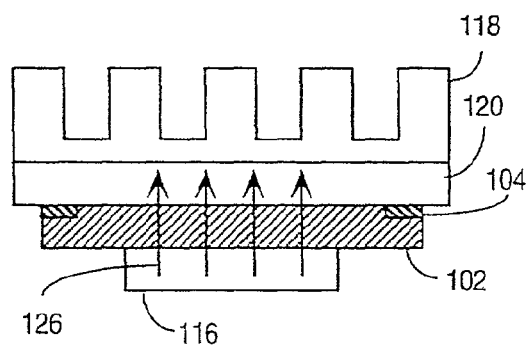
FIG. 6 illustrates an integrated circuit package attached to the assembly of the heat sink and thermal interface with the PSA applied near the edges of the thermal interface.

FIG. 6 illustrates an integrated circuit package 116 attached to the assembly of a heat sink 118 and of thermal interface 102 attached to the heat sink by way of PSA 104. Integrated circuit package 116 may be attached to the thermal interface 102 by way of screw(s) and/or clip(s) (not shown). Arrows 126 indicate the flow of heat from integrated circuit package 116 to heat sink 118.

Figure 7:
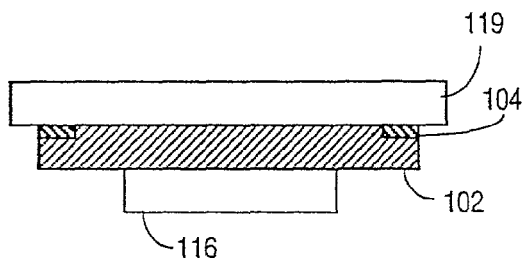
FIG. 7 illustrates an integrated circuit package attached to the assembly of a thermal plate and thermal interface with the PSA applied near the edges of the thermal interface.

FIG. 7 illustrates an integrated circuit package attached to the assembly of a thermal plate 119 and of thermal interface 102. The thermal interface 102 has the PSA 104 applied near the edges of the thermal interface.

Figure 8:
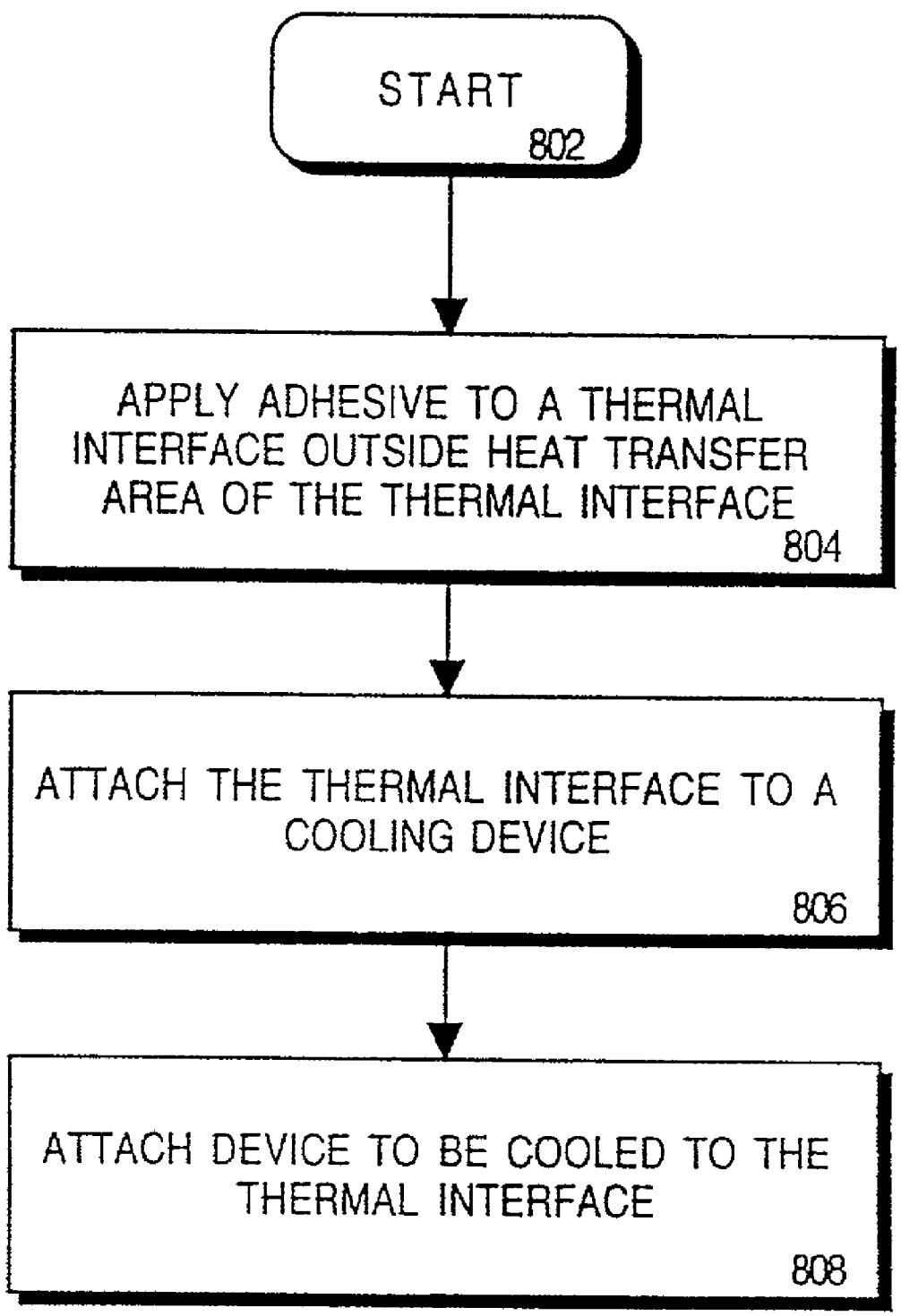
FIG. 8 illustrates a flow chart diagram of a method of providing thermal connection between a cooling device and a device to be cooled according to one embodiment of the present invention.

FIG. 8 illustrates a flow chart diagram of a method of providing thermal connection between a cooling device and a device to be cooled according to one embodiment of the present invention. The method starts at block 802 from where it passes to block 804. At block 804 an adhesive is applied to a thermal interface outside a heat transfer area of the thermal interface. The method then flows to block 806 where the thermal interface is attached to a cooling device. Next the method flows to block 808 where the device to be cooled is attached to the thermal interface.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarding in an illustrative rather than a restrictive sense. Therefore, the scope of the invention should be limited by the appended claims.

What is claimed is:

1. An apparatus comprising:
   a thermal interface material having a first side to attach to a cooling device, and a second side to receive heat from an integrated circuit by contacting the integrated circuit at a heat transfer area; and
   an adhesive attached to the first side wherein the adhesive is attached to a portion of the first side that is outside the heat transfer area,
   wherein the adhesive is attached along a plurality of edges of the thermal interface material, and wherein the plurality consists essentially of two.

2. The apparatus of claim 1, wherein the thermal interface material comprises a film having a phase-change material to change phase by receiving the heat from the integrated circuit.

3. An apparatus comprising:
   a thermal interface material having a first side to attach to a cooling device, and a second side to receive heat from an integrated circuit by contacting the integrated circuit at a heat transfer area; and
   an adhesive attached to the first side wherein the adhesive is attached to a portion of the first side that is outside the heat transfer area,
   wherein the thermal interface material comprises a tape or film.

4. The apparatus of claim 3, wherein the adhesive is attached along a plurality of edges of the thermal interface material.

5. The apparatus of claim 4, wherein the plurality comprises four.

6. The apparatus of claim 3, wherein the adhesive comprises a pressure sensitive adhesive.

7. The apparatus of claim 3, further comprising the cooling device attached to the first side of the thermal interface material.

8. The apparatus of claim 7, further comprising the integrated circuit attached to the second side of the thermal interface material.

9. An apparatus comprising:
a thermal interface material having a first side to attach to a cooling device, and a second side to receive heat from an integrated circuit by contacting the integrated circuit at a heat transfer area; and
an adhesive attached to the first side wherein the adhesive is attached to a portion of the first side that is outside the heat transfer area,
wherein the thermal interface material comprises a phase change material.

10. The apparatus of claim 9, wherein the adhesive is attached along a periphery of the heat transfer area.

11. An apparatus comprising:
a phase changing thermal interface material to thermally couple a cooling device with an integrated circuit, the phase changing thermal interface material comprising:
a heat transfer area between the integrated circuit and the cooling device,
a first surface to receive the heat from the integrated circuit by contacting the integrated circuit within the heat transfer area,
a phase change material to change from a solid phase to a liquid phase by absorbing the heat from the integrated circuit at the first surface, and
a second surface to provide the heat to the cooling device by contacting the cooling device within the heat transfer area; and
an adhesive to attach the thermal interface material to the cooling device, wherein the adhesive is applied to the second surface of the thermal interface material outside of the heat transfer area.

12. The apparatus of claim 11, wherein the thermal interface material comprises a Chomerics T443 film.

13. The apparatus of claim 11, wherein the adhesive comprises a pressure sensitive adhesive.

14. The apparatus of claim 11, wherein the adhesive comprises a strip having a thickness between about 0.0125 millimeters and 0.025 millimeters.

15. The apparatus of claim 11, wherein the adhesive is attached at a plurality of edges of the thermal interface material.

16. The apparatus of claim 15, wherein the plurality consists essentially of two.

17. The apparatus of claim 11, wherein the adhesive is attached along a periphery of the thermal interface material.

18. The apparatus of claim 11, further comprising the cooling device attached to the second surface of the thermal interface material to provide the heat to the thermal interface material.

19. An apparatus comprising:
a thermal interface material having a first side to attach to a cooling device, and a second side to receive heat from an integrated circuit by contacting the integrated circuit at a heat transfer area; and
an adhesive attached to the first side wherein the adhesive is attached to a portion of the first side that is outside the heat transfer area,
wherein the adhesive comprises a strip having a thickness between about 0.0125 millimeters and 0.025 millimeters.

* * * * *